(12) United States Patent
Suzuki et al.

(10) Patent No.: US 8,614,544 B2
(45) Date of Patent: Dec. 24, 2013

(54) LIGHT EMITTING DEVICE WITH ELECTRODE HAVING RECESSED CONCAVE PORTION

(75) Inventors: Ryo Suzuki, Komatsushima (JP); Tadao Hayashi, Tokushima (JP); Tomoya Tsukioka, Itano-gun (JP); Yoshikazu Takeuchi, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/383,815

(22) PCT Filed: May 28, 2010

(86) PCT No.: PCT/JP2010/059109
§ 371 (c)(1),
(2), (4) Date: Jan. 12, 2012

(87) PCT Pub. No.: WO2011/007621
PCT Pub. Date: Jan. 20, 2011

(65) Prior Publication Data
US 2012/0112622 A1    May 10, 2012

(30) Foreign Application Priority Data
Jul. 14, 2009  (JP) .................. 2009-166054

(51) Int. Cl.
*H01J 1/00* (2006.01)
(52) U.S. Cl.
USPC ............ 313/326; 313/567; 313/483
(58) Field of Classification Search
None
See application file for complete search history.

(56) References Cited

U.S. PATENT DOCUMENTS

| | | | | |
|---|---|---|---|---|
| 5,949,772 A | * | 9/1999 | Sugikawa et al. | 370/331 |
| 7,242,033 B2 | * | 7/2007 | Isokawa et al. | 257/99 |
| 7,250,637 B2 | * | 7/2007 | Shimizu et al. | 257/98 |
| 7,497,597 B2 | * | 3/2009 | Suehiro et al. | 362/294 |
| 7,824,937 B2 | * | 11/2010 | Suehiro et al. | 438/26 |
| 2003/0189829 A1 | | 10/2003 | Shimizu et al. | |
| 2005/0156187 A1 | | 7/2005 | Isokawa et al. | |
| 2006/0261364 A1 | | 11/2006 | Suehiro et al. | |

FOREIGN PATENT DOCUMENTS

| | | |
|---|---|---|
| JP | 06-120648 | 4/1994 |
| JP | 2003-264267 | 9/2003 |
| JP | 2003-338640 | 11/2003 |
| JP | 2007-059781 | 3/2007 |
| JP | 2007-059930 | 3/2007 |
| JP | 2008-085361 | 4/2008 |

OTHER PUBLICATIONS

Search Report mailed Jun. 22, 2010 in International Application No. PCT/JP2010/059109.

* cited by examiner

*Primary Examiner* — Natalie Walford
(74) *Attorney, Agent, or Firm* — Foley & Lardner LLP

(57) ABSTRACT

A light emitting device comprises a rectangular element mounted upon a mounting substrate via a heat-melted connecting material, wherein second substrate electrodes are formed conforming to the recesses of a first substrate electrode and a portion of the outer periphery of the first and second substrate electrodes is provided with first extended sections that extend farther outward than the outer periphery of the aforementioned element. The aforementioned first extended sections are formed in at least one or more locations per one side of the outer periphery of the aforementioned rectangular element; the aforementioned first substrate electrode is provided with second extended sections that are formed on at least one of both ends of the aforementioned recesses flanking the first extended sections of the aforementioned second substrate electrodes; and the aforementioned second extended sections extend farther outward than the outer periphery of the aforementioned element.

21 Claims, 9 Drawing Sheets

LIGHT EMITTING DEVICE WITH ELECTRODE HAVING RECESSED CONCAVE PORTION

FIELD OF THE INVENTION

The present invention relates to a light emitting device, in which elements such as light emitting elements are mounted on a mounting substrate such as a semiconductor insulating substrate.

BACKGROUND

A surface-mounting type light emitting device with a light emitting element such as a light emission diode (LED) or a laser diode (LD) mounted on a substrate is conventionally well known. The light-emitting device has been used in lighting equipment, a backlight for display screen, an automotive illuminant, a display illuminant, and an auxiliary illuminant for motion pictures, as well as for other general consumer illuminants. In those applications, a device with a configuration comprising both anodes and cathodes mounted on the same surface is widely used in order to enhance its light extraction efficiency. A widely proposed light-emitting device has a configuration comprising chips mounted, by a flip-chip method, on an insulating substrate, on which wiring patterns are formed.

One example of the light emitting device is manufactured by applying a solder paste at specific positions on a pair of electrodes formed on a insulating substrate, mounting LED elements by flip-chip mounting in order to bond the LED elements, and melting the solder paste by reflowing in order to make the electrodes and the LED elements electrically connected to each other. If the pair of the electrodes formed on the insulating substrate of the light emitting device are formed into a shape identical to that of the electrodes on the side of the LED elements, when the LED elements are mounted by pressing themselves against the electrodes, a portion of the solder paste applied on the insulating substrate bulges out around the electrode, comes off the electrodes during the reflowing process, and forms a solder ball.

Therefore, conventional light emitting devices are known to have such a configuration described in JP1994-12648A ("JP '648") to prevent the solder ball generation in the light emitting device production process. That is, JP '648 discloses a configuration for preventing solder ball generation by providing a redundant reflow pad along the outer circumference of the LED element.

Further, JP2003-264267A ("JP '267") discloses another configuration which ensures self-alignment by setting a length and a width of a rectangular die pad at 0.5-1.5 times of those of the rectangular light emitting diode of the light emitting device. JP '267 also discloses a configuration in which extended sections extending from each of the four sides of the light emitting diode are provided when a light emitting diode is mounted on the die pad at the side of the insulating substrate. The extended sections are able to lower the height of the molten solder deposited on the surface of the die pad so that self alignment by the surface tension of the molten soldier is ensured.

Despite the above-mentioned prior art conventional light emitting devices have the following problems.

In the configuration of the light emitting device of JP '648, the shape of the redundant reflow pad, which is formed to be larger than the electrode section of the element, is not suitable for self-alignment performance. Therefore, improper self-alignment is a problem, which causes an improper positioning of the mounted light emitting element at the time of the reflowing process.

Although the configuration of the light emitting device of JP '267 may enable self-alignment during the reflowing process, in this document, the mechanism of self-alignment assumes the shape of the die pad as a single unit. Therefore, when the device comprises separate die pads for one element such as a light emitting diode, in other words, when the configuration of the device comprises multiple electrodes on the side of a substrate, such as a first substrate electrode and a second substrate electrode mounted at separate positions on the substrate, the configuration is unsatisfactory for performing self-alignment while preventing the solder ball generation.

In particular, when the electrodes formed on the substrate, at the time of flip-chip mounting of the element, are a first electrode and a second electrode, corresponding to a P-type electrode and a N-type electrode, and are separated from each other, the molten solder may converge towards the second electrode from the first electrode. Therefore, the converging molten solder forms an excessive connecting thickness of the second electrode, and may lift up some portion of the molten solder around the first electrode, generating voids in the molten solder near the first electrode. Therefore, a method for prevention of the voids around the first electrode in a light emitting device is desired.

The objective of the present invention made in view of the above-mentioned problems is to provide a light emitting device that secures self-alignment, and prevents the generation of solder balls as well as the generation of voids in molten solder under the electrodes, even in case of electrodes formed separately from each other on a substrate having a single mounted element.

SUMMARY OF THE INVENTION

In order to attain the objectives of the present invention, the light emitting device of a first embodiment has a configuration, in which a light emitting device comprises: a substrate including a first substrate electrode and a second electrode, both of which are formed on the substrate; and an element in a rectangular shape, the element including a first element electrode and a second element electrode, which are formed inside an outer periphery of the element and aligned respectively with the first substrate electrode and the second substrate electrode via a heat-melted connecting material, wherein: each of the first substrate electrode and the second substrate electrode is formed into a shape which is identical with at least a portion of an outer periphery of one of the first element electrode and the second element electrode, which is aligned with the each of the first substrate electrode and the second substrate electrode; the first substrate electrode is provided with a recessed concave portion, which is formed by cutting off a portion on the outer periphery of the first substrate electrode; the second substrate electrode is formed along and off the recessed concave portion of the first substrate electrode; each of the first substrate electrode and the second substrate electrode includes one or more of first extended sections each extending outward outside the outer periphery of the element; the one or more of the first extended sections are formed on each side of the outer periphery of the first substrate electrode; and the first substrate electrode is provided with a second extended section formed along and off at least one of both ends of the first extended section of the second substrate electrode, the second extended section extending outward outside the outer periphery of the element.

In the above configuration, the light emitting device comprises the first substrate electrode and the second substrate electrode, wherein at least one portion of the outer periphery of the substrate electrodes is formed into a shape aligned to and identical with the shape of portion of the first element electrode and the second element electrode. Therefore, at the time of mounting the element on the mounting substrate, a heat-melted connecting material is reflowed to be melted, whose surface tension allows the electrodes to perform self-alignment, which will secure the element on the predetermined mounting position. The light emitting device also comprises the first and the second substrate electrodes provided with the first extended section. Therefore, at the time of self-alignment, the surface tension of the melted heat-melted connecting material running along the first extended section prevents the generation of solder balls outside the electrodes. Moreover, the light emitting device further comprises the second extended section formed in the first substrate electrode to flank the first extended section of the second substrate electrode. Therefore, the second extended section contributes to preventing excessive convergence of the reflowing heat-melted connecting material.

The light emitting device of a second embodiment has the configuration of the device of the first embodiment, wherein the second extended section is formed in such a way that a width of the second extended section is equal to or smaller than a width of the first extended section; and that a summation of the width of the first extended section and the second extended section falls in a range of 10% or more to 50% or less of a length of one side of the first substrate electrode from one end of the first substrate electrode to the other end of the first substrate electrode, the one side of the first electrode being assumed to be straightened. The light emitting device with the above configuration enables the elements to achieve a more effective self-alignment of the first electrode or the second electrodes as well as a more effective prevention of the generation of solder balls.

The light emitting device of a third embodiment has the configuration of the device of the first or second embodiment, wherein the first extended section is disposed to be symmetric with respect to a center of each side of the first substrate electrode. In the light emitting device with this configuration, more than one extended section present around the center are also disposed on the positions symmetrical with respect to the center of one side of the element. Therefore, the generation of solder balls is effectively prevented because the first extended sections evenly receive the reflowed heat-melted connecting materials, whose surface tension is very likely to draw a portion of the connecting materials towards the center of the side in a top view state of the connecting material immediately after it is applied on the electrodes.

The light emitting device of a fourth embodiment may have the configuration of the device of the first or second embodiment, wherein the first substrate electrode is further provided with a third extended section on a corner of the first substrate electrode, the third extending section extending outward outside the outer periphery of the element in a direction of a diagonal line of the first substrate electrode.

In the light emitting device with this configuration, the heat-melted connecting material runs on the third extended sections to be stuck there in such a case as an abundantly applied heat-melted connecting material covering the corners of the first substrate electrode. Therefore, despite the abundance of the applied heat-melted connecting material, the height of the element mounted on the first and second substrate electrodes can be leveled with other elements.

The light emitting device of a fifth embodiment has the configuration, in which a light emitting device comprises: a substrate including a first substrate electrode and a second electrode, both of which are formed on the substrate; and an element in a rectangular shape, the element including a first element electrode and a second element electrode, which are formed inside an outer periphery of the element and aligned respectively with the first substrate electrode and the second substrate electrode via a heat-melted connecting material, wherein: each of the first substrate electrode and the second substrate electrode is formed into a shape which is identical with at least a portion of an outer periphery of one of the first element electrode and the second element electrode, which is aligned with the each of the first substrate electrode and the second substrate electrode; the first substrate electrode is provided with a recessed concave portion, which is formed by cutting off a portion on the outer periphery of the first substrate electrode; the second substrate electrode is formed along and off the recessed concave portion of the first substrate electrode; each of the first substrate electrode and the second substrate electrode includes one or more of first extended sections each extending outward outside the outer periphery of the element; the one or more of the first extended sections are formed on each side of the outer periphery of the first substrate electrode; and the first extended section of the second substrate electrode is a portion, which extends outward outside the outer periphery of the element either in a way the portion is a part of an enlarged connecting area larger than the second element electrode aligned with the portion, or in a way the disposition of the second substrate electrode with respect to the recessed portion of the first substrate electrode is displaced outward from the position of the second substrate electrode aligned with the second element electrode.

In the above configuration, the light emitting device comprises the first substrate electrode and the second substrate electrode, at least one portion of which is formed into a shape aligned to and identical with a portion of the first element electrode and the second element electrode. Therefore, at the time of mounting the element on the mounting substrate, the heat-melted connecting material is reflowed to be melted, whose surface tension allows the electrodes to perform self-alignment, which will secure the element at the predetermined mounting position. The light emitting device also comprises the first and the second substrate electrodes provided with the first extended sections. Therefore, at the time of the self-alignment, the surface tension of the melted heat-melted connecting material running along the first extended sections prevents the generation of solder balls outside the electrodes.

The light emitting device of a sixth embodiment has the configuration, in which a light emitting device comprises: a substrate including a first substrate electrode and a second substrate electrode, both of which are formed on the substrate; and an element in a rectangular shape, the element including a first element electrode and a second element electrode, which are formed inside an outer periphery of the element and aligned respectively with the first substrate electrode and the second substrate electrode via a heat-melted connecting material, wherein: each of the first substrate electrode and the second substrate electrode is formed into a shape which is identical with at least a portion of an outer periphery of one of the first element electrode and the second element electrode, which is aligned with the each of the first substrate electrode and the second substrate electrode; the first substrate electrode is provided with a recessed concave portion, which is formed by cutting off a portion on the outer periphery of the first substrate electrode; the second substrate electrode is formed along and off the recessed concave portion of the first substrate electrode; and the first substrate electrode is provided with an extended section formed on at least one of both ends of the recessed concave portion, the extended section extending outward outside the outer periphery of the element.

In the above configuration, the light emitting device comprises the first substrate electrode and the second substrate electrode, at least one portion of which is formed identical with the first element electrode and the second element electrode. Therefore, at the time of mounting the element on the mounting substrate, a heat-melted connecting material is reflowed to be melted, whose surface tension allows the electrodes to perform the self-alignment, which will secure the element on the predetermined mounting position. The emitting device comprises the extended section (the second extended section) formed in the first substrate electrode. Therefore, the extended section (the second extended section) contributes to prohibiting the reflowing heat-melted connecting material from excessive convergence at the time of self alignment.

The light emitting device of the present invention has the following marked advantages.

The light emitting device with the first extended section and the second extended section prevents the reflowed heat-melted connecting material from generating solder balls while ensuring an excellent self-alignment performance. Therefore, the devices can be produced as high quality products, which are not affected by irregular alignments among the products generated in a mass assembly.

In particular, the light emitting device provided with the second extended section flanking the first extended sections prevents the reflowing heat-melted connecting material from converging towards the second substrate electrodes. Therefore, an excellent state of connection between the first substrate electrode and the first element electrode is attained.

The light emitting device further provided with a third extended section in the first substrate electrode can, after reflowing process, level the height of the elements, which are connected with each other by means of the heat-melted connecting material.

The light emitting device with the first extended section can, at the time of reflowing of the heat-melted material, prohibit the generation of solder balls while ensuring excellent self-alignment performance.

DETAILED DESCRIPTION

In the following sections, embodiments of the light emitting device of the present invention are described with reference to the figures.

Figure 1:
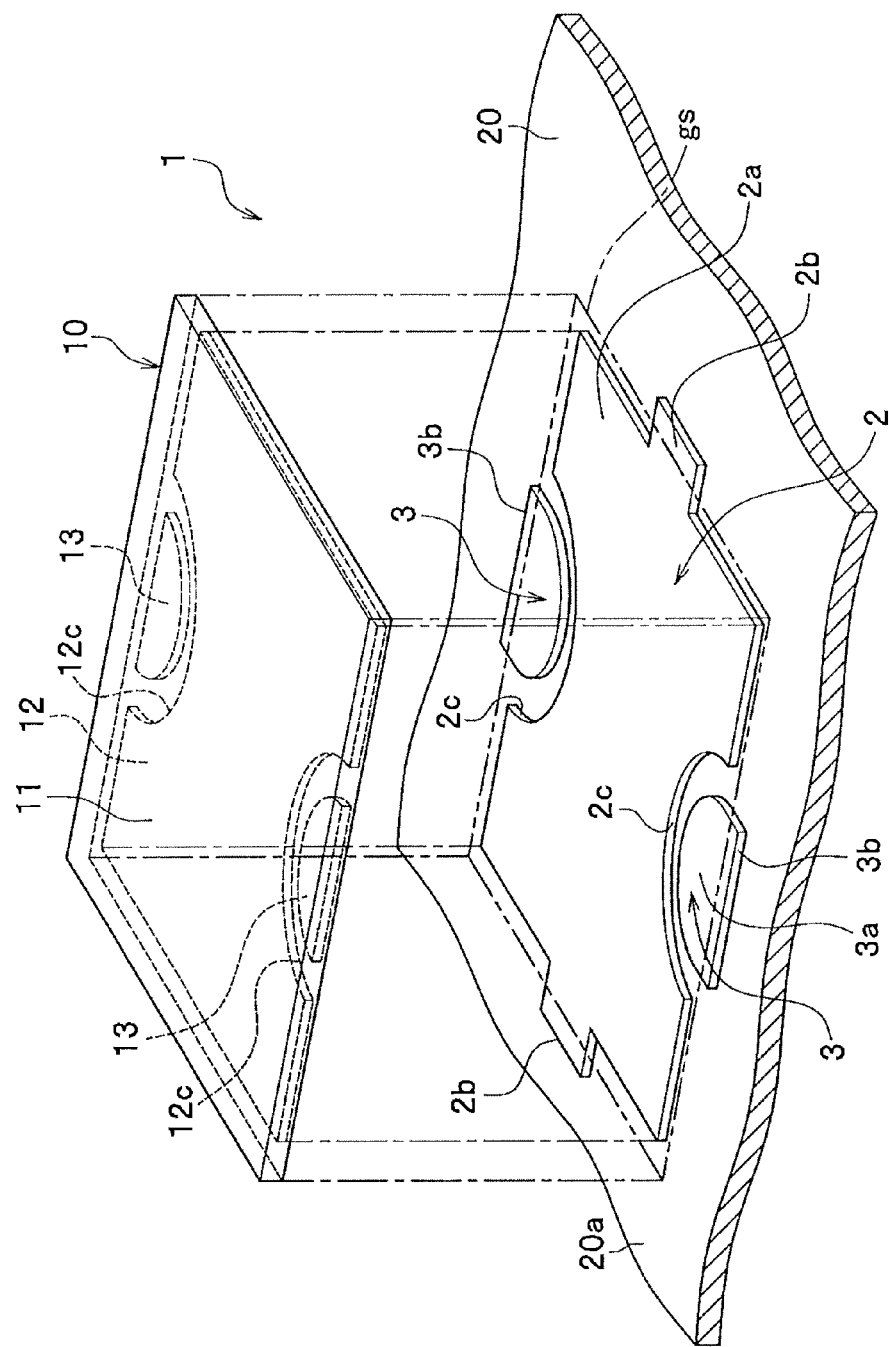
FIG. 1 is a schematic exploded perspective view illustrating the configuration comprising the first and the second substrate electrodes of the mounting substrate, and the first and the second element electrodes of the light emitting element, and their arrangement with respect to each other in the first embodiment of the light emitting device of the present invention.
Figure 2:
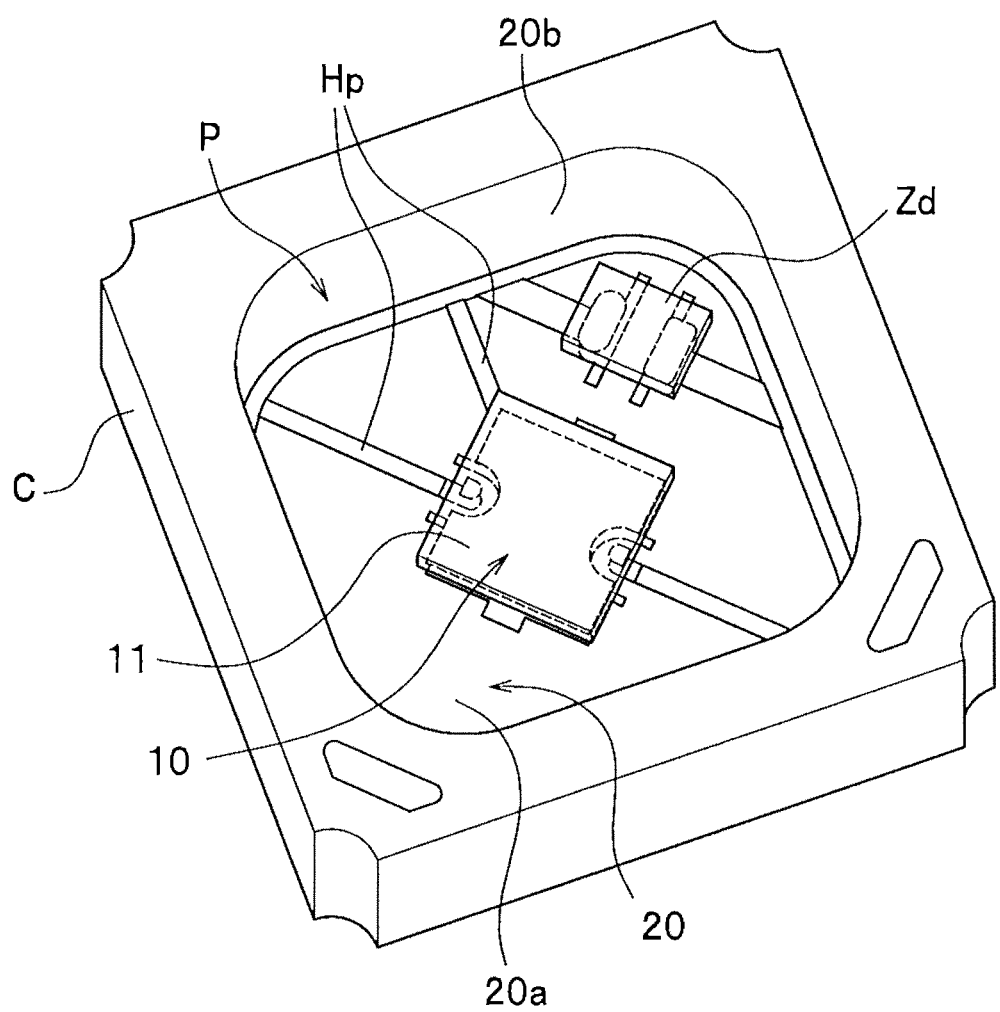
FIG. 2 is a schematic perspective view of the entire light emitting device of the present invention.

As shown in FIGS. 1 and 2, the light emitting device 1 is provided with a mounting substrate 20 formed to have a recessed portion in its center, and with a light emitting element (an element) 10, such as a LED chip, mounted on the central recessed portion of the mounting substrate 20. One example of the light emitting device 1 has a configuration comprising: a case C encompassing the recessed portion formed in the center of the mounting substrate 20; a wiring pattern Hp formed on the substrate's top face 20a where the light emitting element 10 is to be mounted in the center; the light emitting element 10 electrically connected, via an applied heat-melted connecting material kh such as solder paste, to the substrate electrodes (such as the first substrate electrode 2 and the second substrate electrodes 3) continuously connected to the wiring pattern Hp; and the light emitting element 10 covered with resin P, through which the device 1 gives off the light. In the light emitting device 1, the protective device Zd (e.g. Zener diode) is also employed, whenever required, as part of the configuration comprising the device Zd mounted on the mounting substrate 20 in order to stabilize the performance of the light emitting element 10.

In this example, the light emitting element 10 is mounted with the flip-chip method upon the first substrate electrode 2 and the second substrate electrodes 3 formed to be the mounted component on the top face 20a of the mounting substrate 20. The light emitting device 10 is provided, on one face thereof, with the light emitting section (the light producing section) 11, and, on the other face, with the first element electrode 12 and the second element electrodes 13. One example of the light emitting element 10 comprises a semiconductor light emitting element structure comprising at least: a light emitting layer; semiconductors in a laminated form (not shown in the figures), in which a first conduction type semiconductor, the light emitting layer, and a second conduction type semiconductor are formed in this order on the substrate; and electrodes formed to supply electric current to the laminated form of the semiconductors.

The configuration of the light emitting device 10 is not limited to the above-mentioned configuration, and the device 10 may have another configuration, such as one having other semiconductor materials, or may be properly provided with protective layers or reflection layers (not shown in the figures).

In order to obtain white light emission, for example, the light emitting device 10 may have a configuration in which a fluorescent material layer, made from fluorescent material or resin containing fluorescent material, covers the outer side of a semiconductor light emitting element structure (not shown in the figures) emitting a blue light. For example, the white light emission is obtainable with the combination of a blue-light-emitting semiconductor light emitting element structure and a yellow-light-emitting cerium-activated YAG (yttrium/aluminium/garnet) type fluorescent material or a silicate fluorescent material such as $(Sr, Ba)_2SiO_4$:Eu.

The color of the emitted light and the structure of the light emitting section 11 of the light emitting element 10 are not limited to this example as long as the section 11 is able to give off the light.

As shown in FIG. 1, the first element electrode 12 and the second element electrodes 13 are formed on the other face of the light emitting element 10 at positions inside the outer periphery of the element 10. The first element electrode 12 comprises one pair of opposing two sides defined by straight lines, and the other pair of opposing two sides provided with the recesses 12c, 12c, each of which is formed to be notched inward.

The second element electrode 13 is formed in alignment with the recesses 12c of the first element electrode 12 at a position separated from the first element electrode 12. The second element electrodes 13 is formed into a D shape defined by a curved line in alignment with the curve of the recess 12c and by a straight line linking both ends of the curved line. The second element electrodes 13 is further disposed so that the straight line sections of the outer peripheries of the first and second element electrode 12, 13 may be precisely in line with each other. The material of the first element electrode 12 and the second element electrode 13 are not limited to this example, and any material generally used as an element electrode may be employed.

On the mounting substrate 20, the predetermined wiring pattern Hp (e.g. a substrate electrode) is formed together with the light emitting element 10 mounted on the substrate 20 via the heat-melted connecting material kh such as solder paste. One example of the mounting substrate 20 has a configuration comprising metal-films laminated on a supporting substrate, which is made of laminated aluminium ceramic sheets. The mounting substrate 20 is provided, in the top face 20a formed into a concave shape in the predetermined positions on the substrate, with the first substrate electrode 2 and the second substrate electrode 3 formed into the shapes corresponding to the first element electrode 12 and the second electrode element 13 of the light emitting element 10, and with unillustrated external electrical connection terminals for an electrical connection with a driving circuit outside the device.

Figure 3:
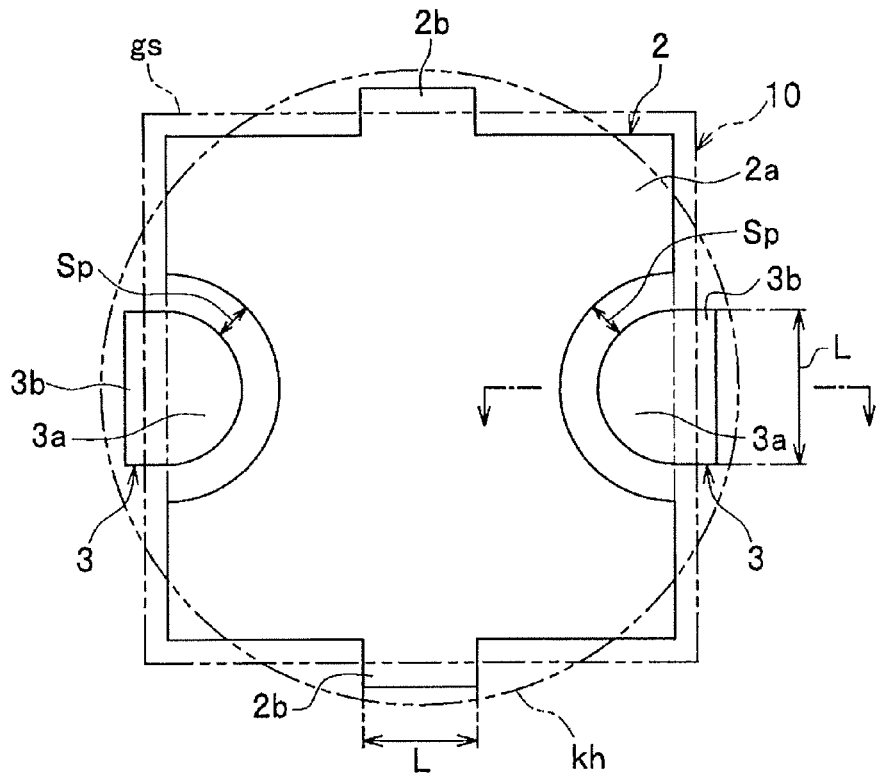
FIG. 3 is a top view of the first substrate electrode and the second substrate electrodes of the light emitting device of the present invention.

As shown in FIGS. 1 and 3, the first substrate electrode 2 on the mounting substrate 20 is formed in the configuration comprising the electrode body 2a, which is the entire first substrate electrode 2 without the first extended sections 2b, 2b, so that the electrode body 2a is aligned to and identical with the first element electrode 12, which is a p-type electrode of the light emitting element 10. In other words, in the configuration of the first substrate electrode 2, the straight line section of the outer periphery of the electrode 2 except the first extended section 2b, together with the curved line section, are aligned to and identical with the outer periphery of the first element electrode. The first substrate electrode 2 is provided with the first extended sections 2b, 2b, each of which is formed on each of one pair of opposing two sides of the electrode 2a, and with the recesses 2c, 2c, each of which is formed on each of the other pair of opposing two sides of the electrode 2a.

Figure 4:
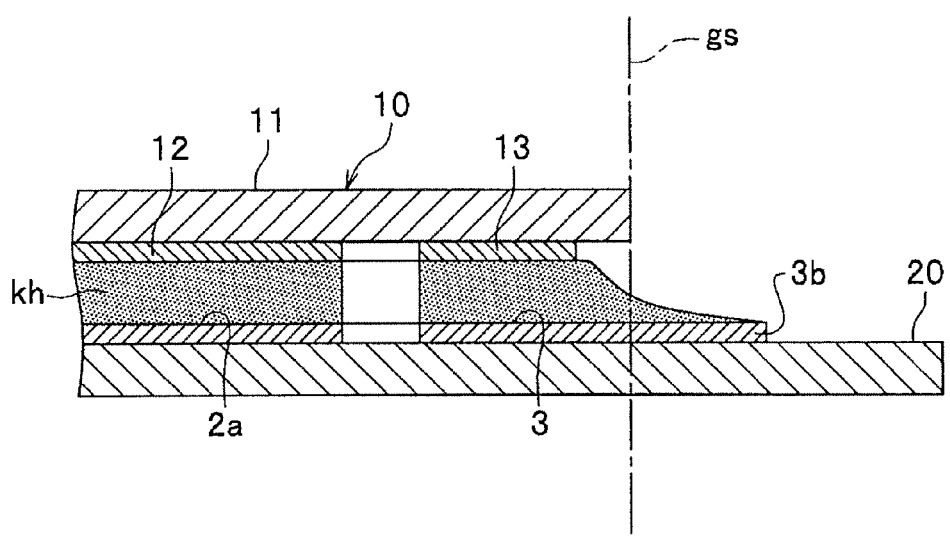
FIG. 4 is a schematic cross sectional view of the state of the reflowed heat-melted connecting material of the light emitting device of the present invention.

The objective of the first extended sections 2b, as well as the later mentioned first extended sections 3b of the second substrate electrode 3, is to prevent the generation of solder balls at the time of reflowing process. Each of the first extended sections 2b is formed in the center of each of one pair of opposing two sides of the electrode body 2a to extend farther outward than the outer periphery gs of the mounted light emitting element 10. The width L of the first extended sections 2b combined with the width of the later mentioned second extended sections 2d falls in the range between 10% or more and 50% or less of the length of the one side that is an assumed straight line of one side of the electrode body 2a of the first substrate electrode 2. As shown in FIG. 4, the formation of the first extended sections 2b causes the heat-melted connecting material kh to run across the first extended sections 2b, allowing the surface tension of the heat-melted connecting material kh to prevent the generation of ball-looking substrates (solder balls).

Too small an area of the first extended sections 2b, whose length L is smaller than 10% of the length of one side of the electrode body 2a, will render the prevention of the generation of the solder balls more difficult to achieve. The first extended sections 2b, whose length L is more than 50% of the length of one side of the electrode body 2a, diminishes the identical section of the shape of the first substrate electrode 2 with the straight line section of the outer periphery of the first element electrode 12, affecting the self-alignment performance. Therefore, the length L should be determined to fall in the range between 10% and more and 50% or less, preferably 10% or more and 45% or less, more preferably 15% or more and 40% or less of the length of the one side that is an assumed straight line of one side of the electrode body 2a.

The extending length of the first extended section 2b is not limited to this example as long as the section 2b extends farther outward than the outer periphery gs of the light emitting element 10. Of course, the first extended section 2b may be formed to have a larger extending length in accordance with other components in the configuration.

Although FIG. 3 shows the first extended section 2b having an edge section with a straight line, which is extended farther outward than the outer periphery gs of the element, and is formed into a strip-like rectangular shape, the shape of the edge section extended to gain a certain width of the section is not limited to this example.

Each of the recesses 2c, 2c forms the area where the later mentioned second substrate electrode 3 is disposed, and is formed at the center of each of the other pair of sides of the electrode body 2a to be notched into a concave shape farther inward than the outer periphery of said electrode body 2a. The position, shape, size, and curvature of the recesses 2c, 2c are not limited to this example as long as the recesses are formed in accordance with the shape of the first element electrode 12 of the mounted light emitting element 10.

As shown in FIG. 3, in the linear and curved section defining the outer periphery of the first substrate electrode 2, the linear section (except the first extended section 2b) and the curved section of the recess 2c are formed aligned to and identical with, respectively, the linear section and the curved section of the recesses 12c in the outer periphery of the first element electrode 12 of the light emitting element 10. A more inwardly disposed curved portion of the recess 2c of the first substrate electrode 2 than the aligned recess 12c of the light emitting element 10 may allow the self-alignment around the section to leave the heat-melted connecting material kh having an inverted trapezoid cross section, which improves the connecting material kh's precision in the prevention of a short circuit between the electrodes.

The second substrate electrodes 3 are formed, on the mounting substrate 20, in alignment with the recesses 2c, 2c of the first substrate electrode 2, and separated from the electrode 2 by a predetermined gap Sp. This second substrate electrode 3 is, in this example, formed into a D-shape, which is defined by the linear portion parallel to the linear portion (a single side) of the second element electrode 13 of the light emitting element 10 and by the curved portion corresponding to the curved portion of the first element electrode 12 as well as in alignment with the recess 2c of the first substrate electrode 2. The second substrate electrode 3 is also formed to have the first extended section 3b, which extends continuously from a connecting section 3a farther outward than the outer periphery of the light emitting element 10. This first extended section 3b is formed to place the portion, sandwiched between the linear section of the second substrate electrode 3 and the edge at the predetermined position of the extended section 3b, outside the periphery of the light emitting element 10, adding an extra portion to the essential area (of the second element electrode).

As shown in FIGS. 1 and 3, the connecting section 3a of the second substrate electrode 3 is a section which is aligned to the second element electrode 13. The first extended section 3b of the second substrate electrode 3 also refers to the section that is outer from the linear section of the electrode body 2a, and is continuously formed from the connecting section 3a to occupy an area outside the outer periphery gs of the light emitting element 10. With respect to the extending length, the formed width, the shape, etc., the same conditions as the aforementioned first extended section 2b of the first substrate electrode 2 apply to the first extended section 3b. Note that the first extended section 3b of the second substrate electrode 3 is formed to have the width L (area) larger than that of the first extended section 2b of the first substrate electrode 2. The formation of the large width L is meant to prevent the generation of the solder balls coming from the surging portion of the heat-melted connecting material kh, which is more likely to surge around the electrode 3 due to the presence of the gap Sp between the first substrate electrode 2 and the second substrate electrode 3.

Note that the second substrate electrode 3, except the first extended section 3b, is aligned to the second element electrode 13, defining the positions of the electrodes with respect to each other. The first extended section 3b also refers to the entire strip section running along the linear section parallel to the outer periphery gs of the light emitting element 10. The outer periphery gs of the light emitting element 10 refers to the periphery defined by the outer sides of the laminating semiconductor structure in the plane, on which the first element electrode 12 and the second element electrode 13 are formed. The outer periphery of the first substrate electrode 2 and the second substrate electrode refer to the periphery forming the outer side of each of the electrodes.

In the light emitting device 1, as shown FIG. 2, a device such as a protection device Zd, as well as the light emitting element 10, is mounted in a predetermined position. The mounting substrate 20 is formed as a part of the case C, whose side walls are defined by the concave shape formed to surround the center of the laminated sheets (for example, such process as ceramic packaging). Initially, the sheets underwent such processes as printing conductor patterns and, whenever it is necessary, perforation with piercing holes before the lamination. Subsequently, the light emitting element 10 is mounted together with other necessary members onto the top face 20a of the concave substrate of the light emitting device 1; then, the resin P, a sealing agent, is filled into the place where the light emitting element 10 is mounted. Note that the choice of the embodiment of the case C of the light emitting device 1 is not limited to this example as long as the case can be usable for the case C of the light emitting device 1 like the one having an alumina ceramic or conductor patterns plated with a metal reflective to the light emitted from the light emitting element 10 (a metal such as Au or any silver-white colored metal, namely a reflective metal such as Ag or Al, is preferred).

As shown in FIG. 2, the sealing agent resin P seals the case C to confine the entire light emitting device 10 and the upper part of the recessed portion of the mounting substrate 20 (the top face 20a and a portion of the side faces forming the case C) as well as forming a lighting window above the recessed portion in the downstream of the light emitted from the light emitting device 1. In this way, the resin P prevents the open air from degrading the light emitting device 10. The disposition of the light emitting element 10 almost at the center of the resin P (or the external form thereof) in the point of a plan view can make the light from the light emitting element 10 emitted evenly towards the lighting window. The formation of the lighting window from the resin P into the surface of a hemisphere together with the disposition of the light emitting element 10 almost at the center of the hemisphere in the point of a plan view prevents the incidence angle of the incoming light at the hemisphere surface from exceeding the critical angle of incidence.

Apart from the above-mentioned embodiment, the lighting window made from the resin P may have a desired shape, such as a hemisphere surface, a convex surface as a deformed sphere surface, a shell-type, or concave surface in order for the resin P to work as a lens to focus or diffuse the light. The resin comprises such materials as transparent resins and glass. Resins such as a hard silicone resin and epoxy resin are examples of viable resins P.

In the following sections, a description of how to mount the light emitting element 10 onto the mounting substrate 20 is presented referring to FIG. 5. Note that FIG. 5 is assumed to illustrate the states of the recessed portion of the mounting substrate 20 formed into the shape of the case C.

Figure 5A:
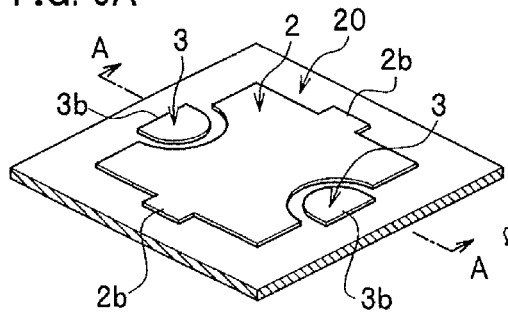
FIGS. 5A-5H are schematic perspective and cross sectional views of the process of mounting the light emitting element onto the mounting substrate of the light emitting device of the present invention via heat-melted connecting material.
Figure 5B:
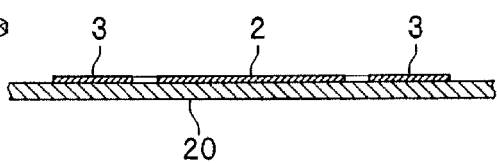

As shown in FIGS. 5A, 5B, the electrode formation process comprises the formation of the first substrate electrode 2 and the second substrate electrode 3 on the mounting substrate 20. The first substrate electrode 2 and the second substrate electrode 3 are formed together with the other circuits on the mounting substrate 20 through a process such as exposure.

Figure 5C:
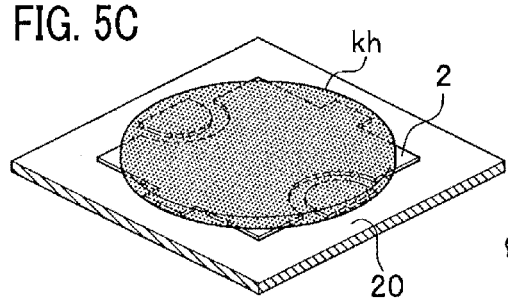
Figure 5D:
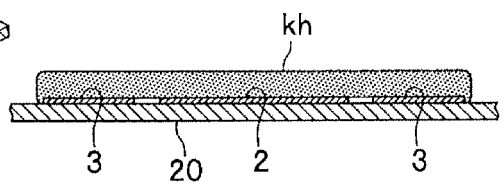

As shown in FIGS. 5C, 5D, the application process comprises the application of the heat-melted connecting material kh (e.g. solder paste) on the first substrate electrode 2 and the second substrate electrode 3 of the mounting substrate 20.

Figure 5E:
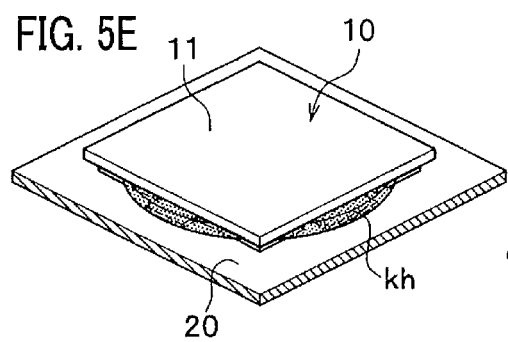
Figure 5F:
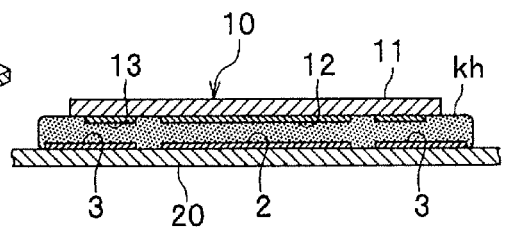

As shown in FIGS. 5E, 5F, the device mounting process comprises mounting the light emitting element 10 onto the heat-melted connecting material kh. In the mounting process, as shown in FIG. 5F, part of the heat-melted connecting material kh is observed to jut out of the light emitting element 10.

Figure 5G:
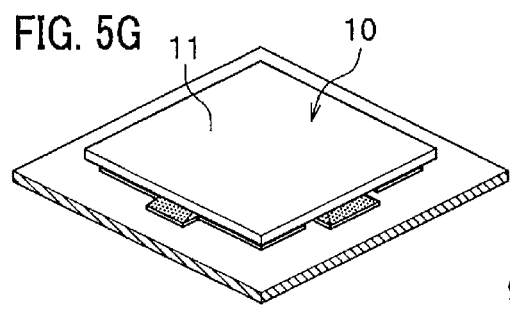
Figure 5H:
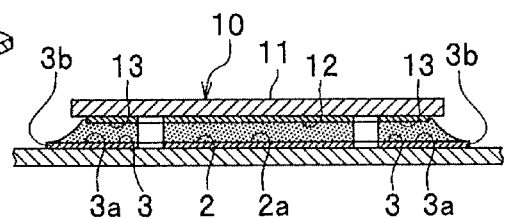

As shown in FIGS. 5G and 5H, the reflowing process comprises heating of the heat-melted connecting material kh. In the process, because of the first extended sections 2b and 3b formed respectively on the first substrate electrode 2 and the second substrate electrode 3, the heat-melted connecting material kh is guided by the first extended sections 2b and 3b to smoothly run on the sections 2b and 3b. The surface tension of the connecting material kh prevents portion of the connecting material kh from being torn to drop into the outside of the extended sections. Therefore, as shown FIGS. 4 and 5H, the heat-melted connecting material kh is placed between the first element electrode 12 and the first substrate electrode 2 opposite to each other and between the second element electrode 13 and the second substrate electrode 3 opposite to each other as well as on the top face of the first extended sections 2b and 3b. In other words, when, in the flip-chip mounting process, the light emitting element 10 is mounted to be electronically and mechanically connected to the first substrate electrode 2 and the second substrate electrode 3 of the mounting substrate 20, solder balls are not generated.

In the reflowing process, the light emitting element 10 is also shifted into a proper position due to the self-aligning motion caused by the surface tension of the heat-melted connecting material kh. Note that, for a diagnostic purpose, a forced self-aligning motion may be attempted by deliberately displacing the light emitting element 10 from the proper mounting position, by a predetermined rotational angle with respect to the first substrate electrode 2 and the second substrate electrode 3 to determine whether the light emitting element 10 actually undergoes the self alignment to be located into the proper position, which is driven by the applied heat in the reflowing process. In other words, the failure of the light emitting element 10 to undergo the self alignment may indicate that either the element 10 or the first substrate electrode 2 and the second electrode 3 have some defects.

The configuration comprising the first substrate electrode 2 and the second substrate electrode 3 ensures the self alignment motion of the light emitting element 10 in the reflowing process, and the heat-melted connecting material kh is prevented from generating solder balls. The mounting of the light emitting element 10 and, optionally, other necessary devices (such as protective device Zd) on the mounting substrate 20 is followed by the filling with the resin P, the sealing agent, into the case C's recessed portion, where the light emitting element 10 is mounted, to produce the light emitting device 1.

Therefore, by the first extended sections 2b and 3b as well as the second extended section 2d, the production process of the light emitting device 1 is prevented from generating solder balls, and is less likely to be affected by the irregularity in mass assembly, and ensures the product's excellent quality.

The lighting operations of the light emitting device 1 are as follows. The light emitting device 1 is connected to an unillustrated external driving circuit at the electric terminal for an external connection. Via the metal film that is a wiring pattern wired on the top face 20a of the mounting substrate 20, the light emitting device 10, which is electrically connected to the first substrate electrode 2 and the second substrate electrode 3, is provided with electric power. The electric power supply prompts the light emitting element 10 to emit light cast outward from the light emitting element 10 via the resin P.

Figure 6:
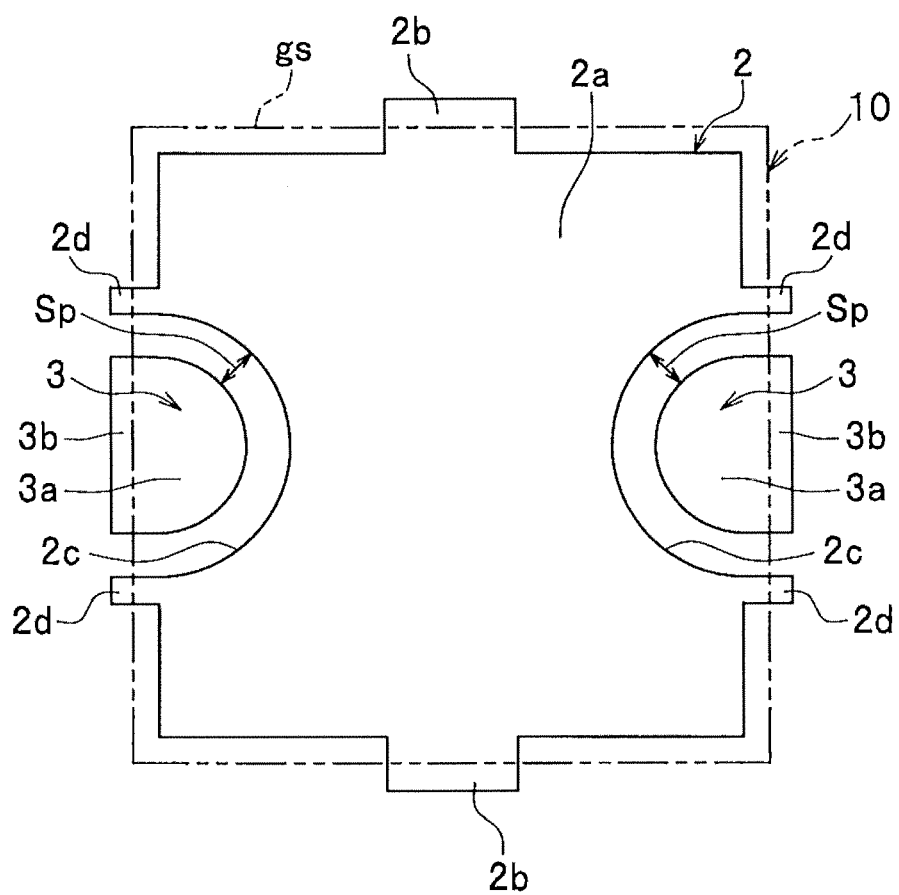
FIG. 6 is a schematic top view of the mounting substrate of the second embodiment in the light emitting device of the present invention.

Specifically, for a flip-chip mounting of the light emitting element 10, a preferred example of the configuration comprising the first substrate electrode 2 is the one illustrated in FIG. 6. In FIG. 6, the same components as the aforementioned components of the light emitting device 1 are given the same reference numbers and the description of the identical components will be omitted. FIG. 6 differs from FIG. 3 in that the second extended sections 2d are further formed. The first substrate electrode 2 and the second substrate electrode 3 are separated from each other by the gap Sp. Therefore, in the reflowing process, the heat-melted connecting material kh is more likely to converge towards the second substrate electrode 3. Therefore, in this example, in order to prevent the excessive convergence of the heat-melted connecting material kh towards the second substrate electrode 3, the second extended section 2d is formed to be parts of the rim of the recess 2c, flanking the first extended section 3b on the two sides. The second extended sections 2d, 2d are formed to occupy the positions between the curved sections and the linear sections of the first substrate electrode 2 (the linear sections' ends closer to the second substrate electrode).

As shown FIG. 6, the second extended section 2d is formed to have an equal extending length to the first extended section 3b of the second substrate electrode 3 to extend farther outward than the outer periphery gs of the light emitting element 10. The second extended section 2d is also formed to have a smaller width than the width L of the first extended section 3b. Additionally, like in the configuration of FIG. 3, the second extended section 2d is formed to have the width which, when combined with the width of the first extended section 2b, does not exceed 50% of the length of one side of the first substrate electrode 2 assuming the end-to-end linearity of said side. Note that the reason why the combined width of the second extended section 2d and the first extended section 2b should not exceed said 50% is the same as previously presented for the first extended section 2b.

The formation of the second extended section 2d prevents an excessive portion of the reflowing heat-melted connecting material kh from running toward the second substrate electrode 3; thus, the generation of defects such as voids in the heat-melted connecting material kh, sandwiched between the first element electrode 12 of the light emitting element 10 and the first substrate electrode 2, is also rendered preventable. At the time of the formation of the first substrate electrode 2 and the second substrate electrode 3, the second extended section 2d is also formed likewise on the mounting substrate 20. It should be noted that the light emitting element 10 of this working example has an identical shape with the one illustrated in FIG. 2.

Figure 7A:
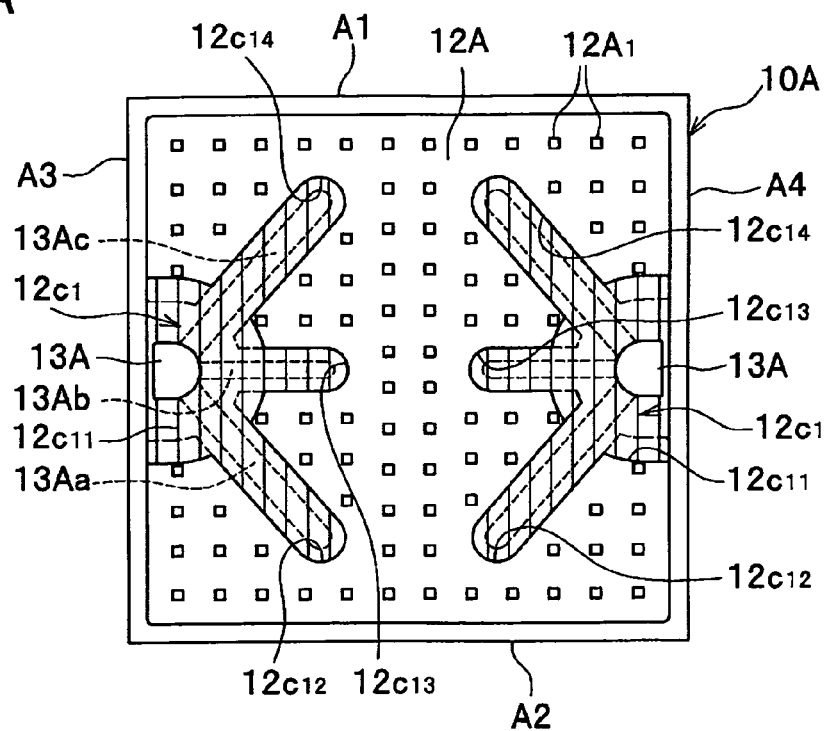
FIGS. 7A and 7B are a schematic bottom view and a schematic top view of the mounting substrate and the light emitting element in the third embodiment of the light emitting device of the present invention.
Figure 7B:
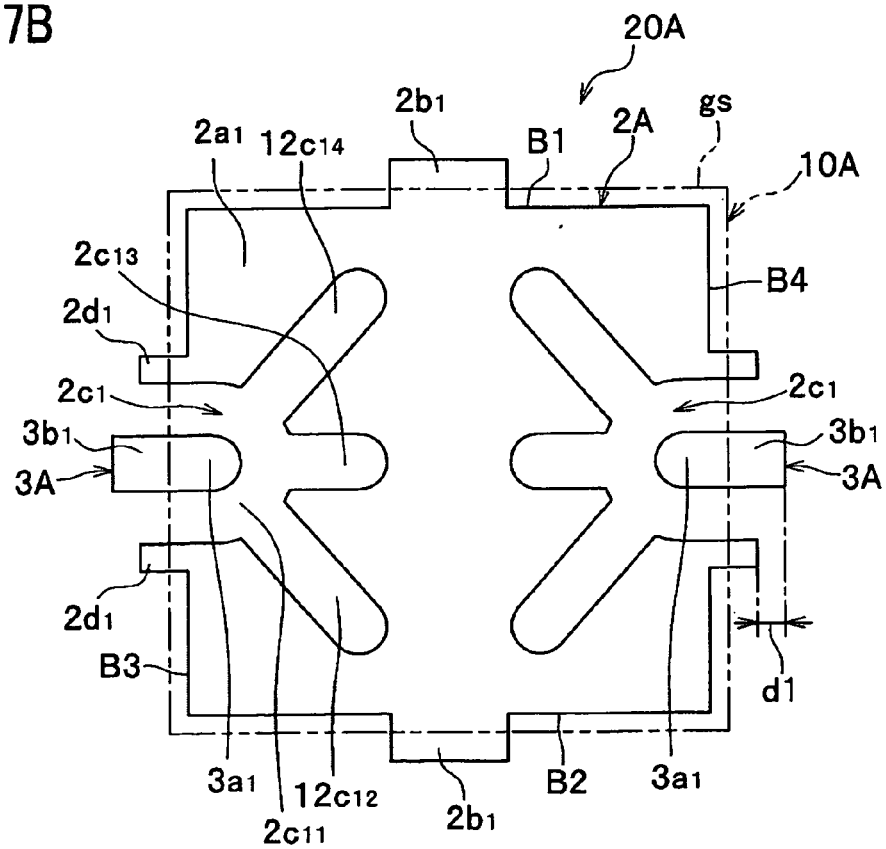

The first substrate electrode 2A and the second substrate electrode 3A in the configuration illustrated in FIG. 7B, may be also employable. In this case, the light emitting element 10A in the configuration illustrated in FIG. 7A is adopted according to the configuration comprising the first substrate electrode 2A and the second substrate electrode 3A. The previous description is valid to the relation of sizes between the first extended section 2b1 and the second extended section 2d1, and to their ratio to the length of the one side.

FIG. 7A illustrates the light emitting element 10A provided with the light emitting section (not shown) on one face (on the front face), and with the first element electrode 12A and the second element electrode 13A on the other face.

In the first element electrode 12A the entire surface inside the outer periphery forms an electrode provided with a plurality of the electrode recessed portions 12A1 formed with predetermined intervals. The first element electrode 12A is also provided with one pair of opposing linear sides A1 and A2 across the electrode and with the other pair of opposing sides A3 and A4 having the recesses 12c1 notched inward. The recess 12c1 comprises the semicircle concave section 12c11 and the concave grooves 12c12, 12c13, and 12c14. All the grooves extend continuously from the semicircle concave section 12c11 towards the side across the electrode or towards the adjacent sides.

The concave groove 12c13 is formed to run parallel to the adjacent sides A1 and A2 with the depth of notch reaching around one third the way from the side A3 towards the side A4. The concave grooves 12c12 and 12c14 are formed to be symmetric with respect to the concave groove 12c13 at the center. The concave groove 12c12 is also formed to run towards the near center of the side A2 with the definite tilting angle to reach the almost same level of the notch depth as the concave groove 12c13 towards the side A4 across the electrode 12A. The concave groove 12c14 is also formed to run towards the near center of the side A1 with the definite tilting angle to reach the almost same level of the notch depth as the concave groove 12c13 towards the side A4 across the electrode 12A.

Each of the second element electrodes 13A, 13A is formed to be disposed in the recess 12c1 of the first element electrode with the predetermined gap. Each electrode 13A is formed into a shell-like shape defined by the linear section in line with the side A3 or A4 and by the curved section connecting the ends of the linear section in alignment with the recess 12c1. Each of the second element electrodes 13A, 13A is provided with the support electrode 13Aa, 13Ab, or 13Ac formed along the concave groove 12c12, 12c13, or 12c14. In this example, the recess 12c1 section, which is the section comprising the semicircle concave section 12c11 and the concave grooves 12c12, 12c13, and 12c14 connected to the concave section 12c11 is covered by an insulating protective film (illustrated by vertical lines in a hatch pattern). Therefore, the surfaces of the second element electrodes 13A, 13A are separated from the surface of the first element electrode 12A by the insulating protective film, which allows the surface of the electrode 13A to be exposed without cover of the insulating protective film.

As illustrated in FIG. 7B, the first substrate electrode 2A and the second substrate electrode 3A are connected to (mounted beneath) the first element electrode 12A and the second element electrode 13A via heat-melted connecting material kh (refer to FIG. 5). In the first substrate electrode 2A, the first extended sections 2b1, 2b1 are formed respectively in one pair of the opposing sides B1, B2 across the electrode 2A, and the recesses 2c1, 2c1 are formed to be notched inward respectively in the other pair of the opposing sides B3, B4.

The extended sections 2b1, 2b1 are in the identical shape as comprising the aforementioned first extended sections 2b, 2b, therefore, no further description of the sections 2b1 will be presented.

Each of the recess 2c1, 2c1, is formed into a shape with a curved portion, which is aligned to and almost identical with the recess 12c1 of the first element electrode 12A, and comprises the semicircle concave section 2c11 and the concave grooves 2c12, 2c13, and 2c14 connected to the semicircle concave section 2c11 to extend towards the side across the electrode or towards the adjacent sides.

The concave groove 2c13 is formed to run parallel to the adjacent sides B1 and B2 with the depth of notch reaching around one third the way from the side B3 towards the side B4. The concave grooves 2c12 and 2c14 are formed symmetric with respect to the concave groove 2c13 at the center. The concave groove 2c12 is also formed to run towards the near center of the side B2 with the definite tilting angle to reach the almost same level of the notch depth as the concave groove 2c13 towards the side B4 across the electrode 2A. The concave groove 2c14 is also formed to run towards the near center of the side B1 with the necessary tilting angle to reach almost the same level of the notch depth as the concave groove 12c13 towards the side B4 across the electrode 2A.

As illustrated in FIG. 7B, the second extended sections 2d1 are formed on both ends of the recess 2c1 to have an extending length shorter than the later mentioned first extended section 3b1 by d1 as illustrated and to have a width smaller than the later mentioned first extended section 3b1.

The second substrate electrode 3A is formed into a shape of a rectangle with one side curved outward in alignment with the recess 2c1 of the first substrate electrode 2A. The curved side is aligned to and identical with the curved section of the second element electrode 13A. The second substrate electrode 3A is provided with the first extended section 3b1, formed to extend from the linear side, which is across the electrode 3A from the curved side, further outward than the outer periphery gs of the light emitting element 10A. In other words, the second substrate electrode 3A is provided with the connecting section 3a1 aligned to the second element electrode 13A and with the first extended section 3b1 continuously connected to the connecting section 3a1.

Thus, on the mounting substrate 20 (refer to FIG. 1), together with the first extended sections 2b1, 3b1 in the first substrate electrode 2A and the second substrate electrode 3A, the pair of the second extended sections 2d1, 2d1 flanking one of the opposing first extended sections 3b1, 3b1 across the electrode 12A are formed to have the width falling into a specific range (the range of ratio between the width and the length of one side). Therefore, the configuration prevents, while maintaining the self alignment, the convergence of the heat-melted connecting material kh towards the second substrate electrode, 3A rendering the generation of the solder balls of the heat-melted connecting material kh preventable.

It should be noted that the shapes of the first element electrode 12a and the second element electrode 13A of the light emitting element 10A and the shape of the first substrate electrode 2A and the second substrate electrode 3A are formed so that the generation of solder balls of the heat-melted connecting material kh is very unlikely. Moreover, the formation of the concave grooves 2c12, 2c13, 2c14 of the recesses of 2c1, 2c1 in the mounting substrate together with the formation of the concave grooves 12c12, 121c13, 12c14 of the recesses 12c1, 12c1 in the light emitting element 10A can enhance the self alignment performance.

Although an description of the configuration comprising two second substrate electrodes per first substrate electrode has been presented, the configuration comprising one second substrate electrode per first substrate electrode, as shown in FIGS. 8A-8F as examples, may also prevent the generation of the solder balls while likewise maintaining self alignment as previously described.

Figure 8A:
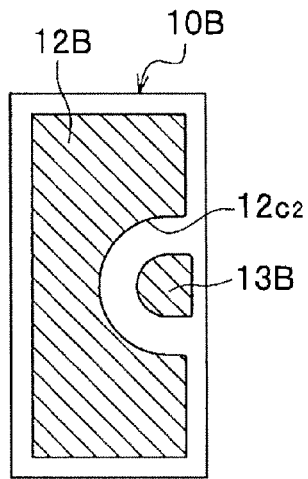
FIGS. 8A-8F are bottom views of the light emitting elements and top views of the first and the second substrate electrodes on the mounting substrate in the fourth to sixth embodiments of the light emitting device of the present invention.

In other words, FIG. 8A illustrates the formation of the recess 12c2 notched inward in one of the longer sides of the rectangle of the first element electrode 12B of the light emitting element 10B, and the formation of the semicircular second element electrode 13B in alignment with the recess 12c2.

Figure 8B:
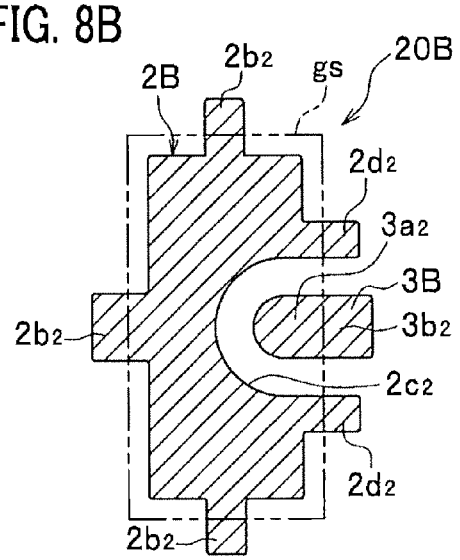

As shown in FIG. 8B, the first substrate electrode 2B is in the configuration comprising the first extended sections 2b2, 2b2 formed in one pair of opposing sides across the electrode 2B, the first extended section 2b2 formed in one of the other pair of opposing sides, and second extended sections 2d2, 2d2 in the other side of said other pair together with the recess 2c2. In the first substrate electrode 2B, the size and the width of the formed first extended section 2b2 are made larger in proportion with the length of each side.

The second substrate electrode 3B is formed into a shape of a rectangle with one short side curving outward. The second substrate electrode 3B is provided with the first extended section 3b2 formed continuously connected to the connecting section 3a2 to extend further outward than the outer periphery gs of the light emitting element 10B.

In this way, just like the previously described configuration, the objective of the present invention is also attainable even by the configuration comprising the second substrate electrode 3B disposed on only one side of the first substrate electrode 2B in alignment with the electrode configuration comprising the light emitting element 10B.

Figure 8C:
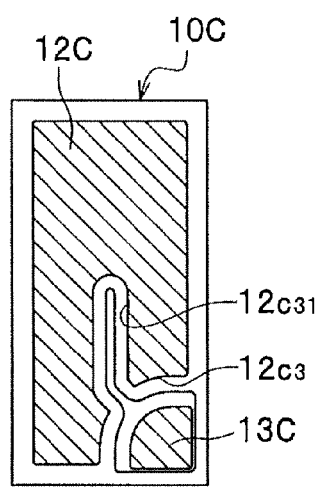

FIG. 8C illustrates the light emitting element 10C provided with the first element electrode 12C comprising the recess 12c3 at one corner of the rectangle, and the second element electrode 13c disposed in alignment with the recess 12c3. Note that the recess 12C3 comprises the concave groove 12c21 formed to run, in said first element electrode 12C, almost half the way towards a shorter side of the first element electrode 12C.

Figure 8D:
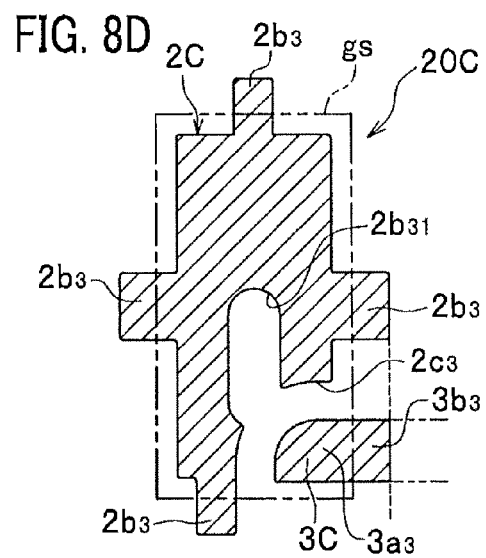

FIG. 8D illustrates the first substrate electrode 2C provided with the recess 2c3 formed at one corner of the rectangle together with the first extended section 2b3 in each side. In the recess 2c3, the concave groove 2b31 is formed to run, in said first substrate electrode 2C, almost half the way towards a shorter side of the first substrate electrode 2C. The longer sides and one of the shorter sides of the first substrate electrode 2C comprise the first extended sections 2b3 in the middle. Moreover, in the shorter side of the first substrate electrode 2C adjacent to the recess 2c3, the first extended section 2b3 is disposed to be continuously connected to the rim of the recess 2c3.

The second substrate electrode 3C is formed into the shape of a rectangle with one round corner. The second substrate electrode 3C is provided with the first extended section 3b3 formed to be continuously connected to the connecting section 3a3 and to extend further outward than the outer periphery gs of the light emitting element 10C. The first extended section 3b3 formed in the second substrate electrode 3C is so formed as to be in line, in one of the four sides defining the rectangle of the light emitting element 10C, with the first extended section 2b3 of the first substrate electrode 2C. In this configuration, the first extended section 3b3 of the second substrate electrode 3C may extend further outward than the position marked by a solid line for the sake of connection to other wiring as indicated by the chain double-dashed lines.

When, like the first substrate electrode 2C, the area ratio of the first substrate electrode to the second substrate electrode is smaller than the one in FIG. 3, and each side is shorter, the first extended section 2b3 of the first substrate electrode 2C works also as the second extended section shown in FIG. 6 for the first extended section 3b3 of the second substrate electrode 3C. Because of the formation of one of the first substrate electrode 2C's first extended sections 2b3, in alignment with the second substrate electrode 3C and extending, from one of the rims of the recess 2c3, further outward than the outer periphery gs of the light emitting element 10C, the first extended section 2b3 can, due to the location it is formed, prevent the convergence of the heat-melted connecting material kh (refer to FIG. 5) towards the second substrate electrode 3C, which is also the objective of the second extended section 2d, while achieving the prime objective of the first extended section 2b3.

Figure 8E:
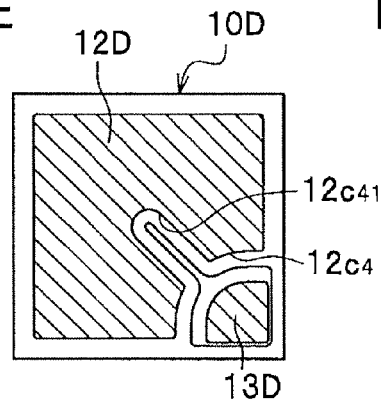
Figure 8F:
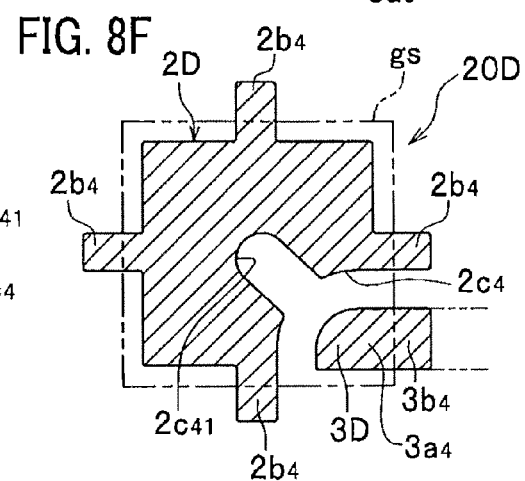

Furthermore, the configuration illustrated in FIGS. 8E, 8F may be employed. As shown in FIG. 8E, the light emitting element 10D is provided with the recess 12c4 formed at one corner of the square, and with the first element electrode 12D with the second element electrode 13D disposed in alignment with the recess 12c4. Note that the recess 12c4 comprises the concave groove 12c41 formed to run, in the first element electrode 12D, almost half the way (up to the center of the square) to the opposite corner across the first element electrode 12D.

FIG. 8F illustrates the first substrate electrode 2D provided with the recess 2C4 formed at one corner of the square, and with the first extended section 2b4 in the middle of each side. The recess 2c4 is provided with the concave groove 2c41 formed to run, in the first substrate electrode 2D, almost half the way to the opposite corner across the first substrate electrode 2D. The first extended sections 2b4 of the first substrate electrode 2D are formed to have an identical width and extending length. Moreover, in this example, the first substrate electrode 2D has a configuration comprising each of two first extended sections 2b4, 2b4 is formed on either rim of the recess 2c4.

The second substrate electrode 3D is formed into a shape of a rectangle with one round corner. The second substrate electrode 3D is provided with the first extended section 3b4 formed to be continuously connected to the connecting section 3a4 and to extend further outward than the outer periphery gs of the light emitting element 10D. The first extended section 3b4 formed in the second substrate electrode 3D is formed so as to be in line, in one of the four sides of the rectangle (square) of the light emitting element 10D, with the first extended section 2b4 of the first substrate electrode 2D. In this configuration, the extended section 3b4 of the second substrate electrode 3D may extend further outward than the position marked by a solid line for the sake of connection to other wiring as indicated by the chain double-dashed lines.

When, like the first substrate electrode 2D, the area is smaller than the one in FIG. 3, and each side is shorter, the first substrate electrode 2D's first extended section 2b4, 2b4 which flank the first extended section 3b4 of the second substrate electrode 3D on both sides, works also as the second extended section shown in FIG. 6. Because of the formation of one of the first substrate electrode 2D's first extended sections 2b4, 2b4, in alignment with the second substrate electrode 3D and extending, from the rims of the recess 2c4, further outward than the outer periphery gs of the light emitting element 10D, the first extended section 2b4 can, due to the location it is formed, prevent the convergence of the reflowing heat-melted connecting material kh (refer to FIG. 5) towards the second substrate electrode 3C, which is also the objective of the second extended section 2d, while achieving the prime objective of the first extended section 2b4.

According to the aforementioned description, the configuration may comprise the substrate electrode like 2C or 2D, in which the first extended section 2b3 or 2b4 is formed in alignment with one or two sides of the recess 2c3 or 2c4 flanking the second substrate electrode 3C or 3D. The configuration allows the first extended section 2b3 or 2b4 to achieve the objectives of the second extended section of the first substrate electrode as well as its prime objectives.

Figure 9A:
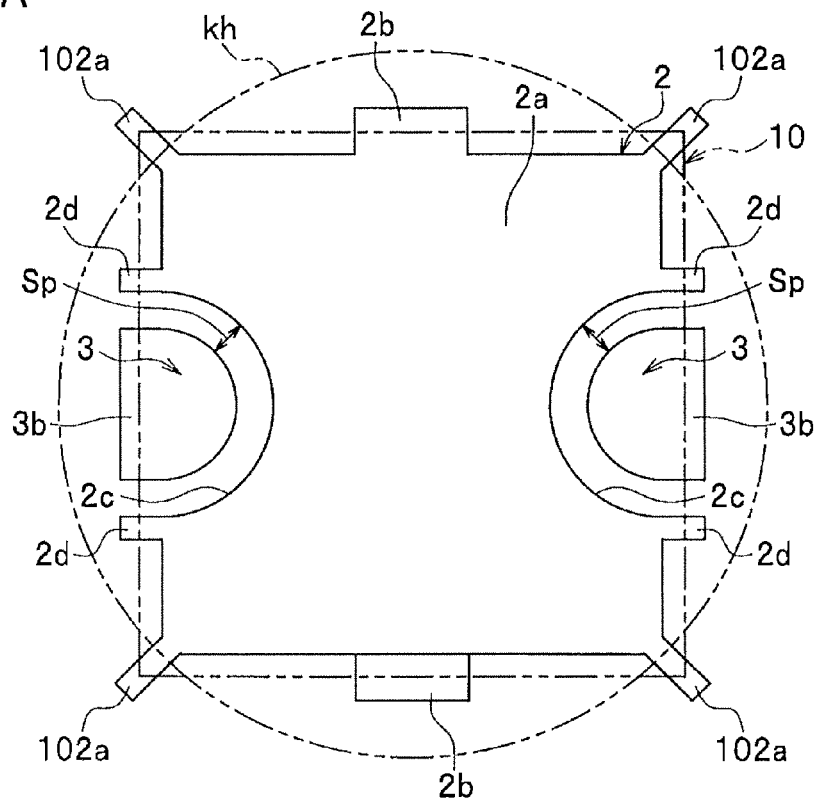
FIGS. 9A and 9B are top views of the state of the third extended sections formed in the first substrate electrode in the seventh embodiment of the light emitting device of the present invention.
Figure 9B:
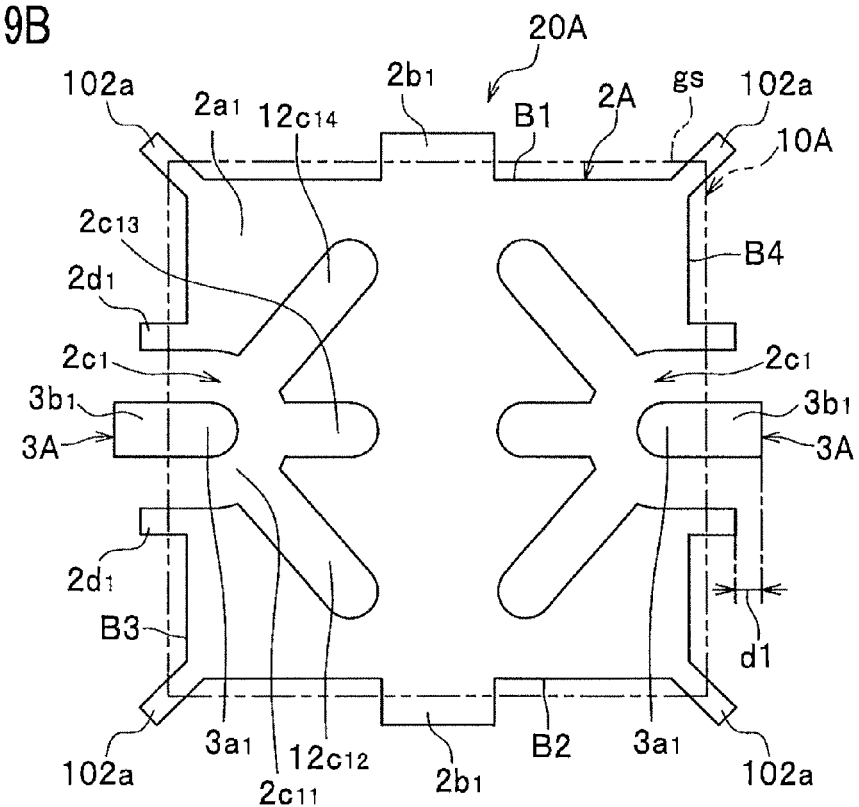

FIGS. 9A and 9B also illustrate other possible examples of the already described first substrate electrode 2 and 2A, which have the third extended sections 102a, 102a on every corners. In FIGS. 9A and 9B, the same components as previously described are denoted by the same number, and their further description will be omitted.

As shown in FIG. 9A the first substrate electrode 2 is provided with the third extended sections 102a formed at the four corners, which extend further outward than the outer periphery gs of the light emitting element 10. The third extended section 102a is formed in such a way that the width of the first extended section 2b or the combined width of the first extended section 2b and the second extended section 2d may not exceed 50% of the length of the assumed straight line corresponding to one side of the first substrate electrode. The illustrated third extended section 102a in the figure having the shape of a rectangle connected to each corner may not exclude a third extended section having a round tip.

As shown in FIG. 9B the third extended section 102a may be formed at a corner of the already described first substrate electrode 2A. The third extended section 102a may be formed under the same conditions as already described.

As shown in FIGS. 9A and 9B, the provision of the first substrate electrodes 2 and 2A with the third extended section 102a causes the reflowing heat-melted connecting materials kh (refer to FIG. 4, FIG. 5) to run on the third extended section 102a, therefore to be able to achieve an even height of the mounted light emitting device 10 even when an excessive amount of heat-melted connecting material kh is applied forming a thick layer. It should be noted that the excessive portion of the applied heat-melted connecting material kh is applied to cover the corners of the first substrate electrode 2, and 2A; therefore, only when an excessive amount is applied, the heat-melted connecting material may run on the third extended section 102a, and when a proper amount is applied, the third extended section 102a may remain unused.

Figure 10:
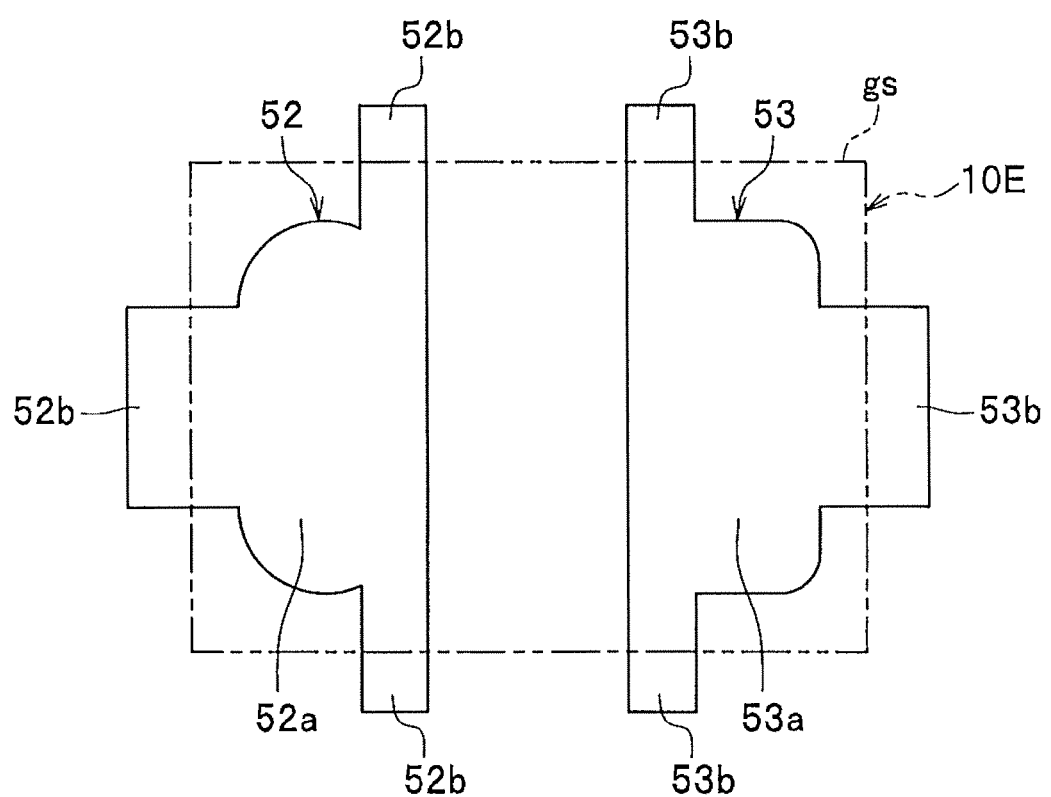
FIG. 10 is a schematic top view illustrating the relation of the light emitting element with respect to the first and the second substrate electrodes of the light emitting device of the present invention.

FIG. 10 also illustrates that the configuration comprising the first substrate electrode 52 and the second substrate 53 of the almost same size, and disposed adjacent to each other, can prevent the generation of the solder balls due to the formation of the first extended section 52b and 53b respectively on the first substrate electrode 52 and the first substrate electrode 53.

In the configuration comprising the first substrate electrode 52 and the second substrate electrode 53, the employed light emitting element 10E is also rectangle, and the first element electrode and the second element electrode (unillustrated) are formed in line inside the outer periphery gs. Like in the already described configuration, the self alignment via the heat-melted connecting material kh (refer to FIG. 5) achieves the mounting of a light emitting element. Note that in this example the shape of one electrode body, electrode body 53a, comprises linear sections while the shape of the other electrode body, electrode body 52b, comprises curved sections in order to avoid mistaking the anode for cathode due to the almost identical size of the first substrate electrode 52 and the second substrate electrode 53. The first extended sections 52b and 53b per one side of the rectangular light emitting element 10E are disposed to extend further outward than the outer periphery of the longer side of the light emitting element 10E. In this way, in the first substrate electrode 52 and the second substrate electrode 53, the increased ratio of the width of the first extended sections 52b and 53b combined to the longer side length is meant to prevent the generation of the solder balls. Two extended sections per one side of the light emitting element 10E are preferably disposed in positions symmetric with respect to the middle of said side.

As has been explained so far, the formation of the first extended section or the second extended section (further of the third extended section) in the first substrate electrode and the second substrate electrode enables the prevention of the generation of the solder balls while maintaining the self alignment performance. Although, in the second substrate electrode, the first extended section continuously connected to the connecting section comes out of the entire linear section of the width parallel to the outer periphery gs of the light emitting element 10, the extended section may come out of only part of the linear section of the width comprising the outer periphery. The second substrate electrode comprises the first extended section formed to be continuously connected to the connecting section, and is shown as an enlarged part of the area aligned to and connected to the second element electrode. This configuration, however, does not exclude the first extended section as a portion of the second substrate electrode, which has no enlarged area aligned to the second element electrode, and which is displaced so that the portion can extend farther outward than the periphery gs of the light emitting element 10.

Although the formation of the light emitting device provided with the first extended section and the second extended section has been described with the reference to FIGS. 1 to 10, the configuration may comprise only the second extended section. In other words, even in a light emitting device without the first extended section, the presence of the second extended section allows the surface tension of the heat-melted connecting material to reduce the generation of solder balls outside the mounting substrate.

The light emitting device of the present invention is especially suited to applications for light sources for illumination, LED displays, lighting source for backlight for LCD, signals, lighting switches, various kinds of sensors and indicators, and auxiliary illuminants for motion pictures, as well as for other general consumer illuminants.

We claim:

1. A light emitting device comprising:
a substrate;
a first substrate electrode and a second substrate electrode, both of which are disposed on the substrate; and
an element having a rectangular shape, the element including a first element electrode and a second element electrode, which are formed inside an outer periphery of the element and aligned respectively with the first substrate electrode and the second substrate electrode via a heat-melted connecting material,
wherein at least a portion of an outer periphery of the first substrate electrode has an identical shape to a shape of at least a portion of an outer periphery of the first element electrode,
wherein at least a portion of an outer periphery of the second substrate electrode has an identical shape to a shape of at least a portion of an outer periphery of the second element electrode,
wherein the first substrate electrode includes a recessed concave portion,
wherein a portion of the outer periphery of the second substrate electrode extends along the recessed concave portion of the first substrate electrode, the second substrate electrode being separated from the first substrate electrode,
wherein each of the first substrate electrode and the second substrate electrode includes one or more first extended sections, each extending outwardly beyond the outer periphery of the element,
wherein the first substrate electrode includes at least two of the first extended sections, at least one first extended section on each of two opposing sides of the first substrate electrode, and
wherein the first substrate electrode includes at least one second extended section, which is adjacent to a first extended section of the second substrate electrode, and on at least one end of the recessed concave portion, the at least one second extended section extending outwardly beyond the outer periphery of the element, and the at least one second extended section being separated from the first extended section of the second substrate electrode.

2. The light emitting device of claim 1, wherein:
a width of the at least one second extended section is less than or equal to a width of the adjacent first extended section, and
a sum of the widths of the at least one second extended section and the adjacent first extended section is between 10% and 50% of an overall width of a corresponding side of the first substrate electrode.

3. The light emitting device of claim 1, wherein each of the first extended sections is symmetric with respect to a center of a corresponding side of the first substrate electrode.

4. The light emitting device of claim 1, wherein the first substrate electrode includes a third extended section on a corner of the first substrate electrode, the third extending section extending outwardly beyond the outer periphery of the element in a diagonal direction.

5. A light emitting device comprising:
a substrate;
a first substrate electrode and a second substrate electrode, both of which are disposed on the substrate; and
an element having a rectangular shape, the element including a first element electrode and a second element electrode, which are formed inside an outer periphery of the element and aligned respectively with the first substrate electrode and the second substrate electrode via a heat-melted connecting material,
wherein at least a portion of an outer periphery of the first substrate electrode has an identical shape to a shape of at least a portion of an outer periphery of the first element electrode,
wherein at least a portion of an outer periphery of the second substrate electrode has an identical shape to a shape of at least a portion of an outer periphery of the second element electrode,
wherein the first substrate electrode includes a recessed concave portion,
wherein a portion of the outer periphery of the second substrate electrode extends along the recessed concave portion of the first substrate electrode, the second substrate electrode being separated from the first substrate electrode,
wherein each of the first substrate electrode and the second substrate electrode includes one or more first extended sections, each extending outwardly beyond the outer periphery of the element, and
wherein the first substrate electrode includes at least two of the first extended sections, at least one first extended section on each of two opposing sides of the first substrate electrode.

6. A light emitting device comprising:
a substrate;
a first substrate electrode and a second substrate electrode, both of which are disposed on the substrate; and
an element having a rectangular shape, the element including a first element electrode and a second element electrode, which are formed inside an outer periphery of the element and aligned respectively with the first substrate electrode and the second substrate electrode via a heat-melted connecting material,
wherein at least a portion of an outer periphery of the first substrate electrode has an identical shape to a shape of at least a portion of an outer periphery of the first element electrode,
wherein at least a portion of an outer periphery of the second substrate electrode has an identical shape to a shape of at least a portion of an outer periphery of the second element electrode,
wherein the first substrate electrode includes a recessed concave portion,
wherein a portion of the outer periphery of the second substrate electrode extends along the recessed concave portion of the first substrate electrode, the second substrate electrode being separated from the first substrate electrode, and
wherein the first substrate electrode includes an extended section on at least one end of the recessed concave portion, the extended section extending outwardly beyond the outer periphery of the element.

7. The light emitting device of claim 5, wherein the outer periphery of the first substrate electrode is aligned with the outer periphery of the first element electrode except at the one or more first extended sections of the first substrate electrode.

8. The light emitting device of claim 5, wherein the outer periphery of the second substrate electrode is aligned with the outer periphery of the second element electrode except at the one or more first extended sections of the second substrate electrode.

9. The light emitting device of claim 5, wherein a width of each first extended section is between 10% and 50% of an overall width of a corresponding side of the first substrate electrode.

10. The light emitting device of claim 5, wherein the first substrate electrode includes at least one second extended section, which is adjacent to a first extended section of the second substrate electrode, and on at least one end of the recessed concave portion, the at least one second extended section extending outwardly beyond the outer periphery of the element, and the at least one second extended section being separated from the first extended section of the second substrate electrode.

11. The light emitting device of claim 10, wherein:
a width of the at least one second extended section is less than or equal to a width of the adjacent first extended section, and
a sum of the widths of the at least one second extended section and the adjacent first extended section is between 10% and 50% of an overall width of a corresponding side of the first substrate electrode.

12. The light emitting device of claim 5, wherein each of the first extended sections is symmetric with respect to a center of a corresponding side of the first substrate electrode.

13. The light emitting device of claim 5, wherein the first substrate electrode includes a third extended section on a corner of the first substrate electrode, the third extending section extending outwardly beyond the outer periphery of the element in a diagonal direction.

14. The light emitting device of claim 5, wherein the first extended section of the second substrate electrode is a part of an enlarged connecting area that extends outwardly beyond an outer periphery of a corresponding second element electrode.

15. The light emitting device of claim 5, wherein the first extended section of the second substrate electrode is formed due to the second electrode displaced outwardly from a position of alignment with the second element electrode.

16. The light emitting device of claim 5, wherein a width of at least one of the one or more first extended sections of the second substrate electrode is larger than a width of at least one of the one or more first extended sections of the first substrate electrode.

17. The light emitting device of claim 5, further comprising a case encompassing a portion of the substrate on which the element is disposed.

18. The light emitting device of claim 17, further comprising a sealing agent resin disposed in the case and covering the element.

19. The light emitting device of claim 5, wherein the recessed concave portion of the first substrate electrode includes one or more concave grooves extending inwardly from the recessed concave portion.

20. The light emitting device of claim 19, wherein the one or more concave grooves include a first concave groove extending parallel to adjacent sides of the first substrate electrode, and at least one additional concave groove extending diagonally relative to the first concave groove.

21. The light emitting device of claim 5, wherein:
the first element electrode includes a recessed concave portion, and
the recessed concave portion of the first substrate electrode extends further inwardly than the recessed concave portion of the first element electrode.

* * * * *